United States Patent [19]

Thornton et al.

[11] Patent Number: 4,557,968

[45] Date of Patent: Dec. 10, 1985

[54] DIRECTIONAL ELECTROSTATIC DISSIPATING FABRIC AND METHOD

[75] Inventors: Peter B. Thornton, Bronxville; Stanley H. Cone; George W. Booz, both of Hornell, all of N.Y.

[73] Assignee: Stern & Stern Textiles, Inc., Hornell, N.Y.

[21] Appl. No.: 648,765

[22] Filed: Sep. 10, 1984

Related U.S. Application Data

[63] Continuation-in-part of Ser. No. 517,124, Jul. 25, 1983.

[51] Int. Cl.$^4$ ............................................. D03D 3/00
[52] U.S. Cl. ..................................... 428/229; 28/167; 57/901; 139/425 R; 428/255; 428/257; 428/258; 428/259; 428/408
[58] Field of Search ...................... 139/425 R; 57/901; 428/229, 225, 257, 258, 259, 408; 28/167

[56] References Cited

U.S. PATENT DOCUMENTS 3,288,175 11/1966 Valko .............................. 139/425 R

*Primary Examiner*—James J. Bell
*Attorney, Agent, or Firm*—Amster, Rothstein & Engelberg

[57] ABSTRACT

A directional electrostatic dissipating fabric and method of making such fabric constructed of a woven or knitted base fabric having an integrally woven or knitted grid structure which is raised above only one surface of the base fabric forming a fabric with a raised grid on one side and a smooth or substantially smooth grid on the other side thereby resulting in increased, directional electrostatic dissipation performance from the side having the raised grid. The grid is formed from an electroconductive yarn plied to a carrier yarn which is then integrally woven or knitted into the fabric in the warp direction, the fill direction or both, thereby producing a fabric which exhibits the rapid, yet controlled, directional dissipation of static electricity into the air. Such fabric can be used for anti-static covering cloths, filtration media and the like; but is particularly adapted for use in anti-static garments and it is particularly comfortable when the smooth or substantially smooth surface is adjacent the wearer and the raised surface is on the outside of the garment.

19 Claims, 4 Drawing Figures

DIRECTIONAL ELECTROSTATIC DISSIPATING FABRIC AND METHOD

FIELD OF THE INVENTION

This is a continuation-in-part of copending application Ser. No. 517,124 filed on July 25, 1983. The parent application relates to a fabric having a woven or knitted base fabric into which an integral grid formed of an electroconductive yarn plied to a carrier yarn is woven or knitted. The grid extends above each surface of the base fabric resulting in a raised grid. Such fabric exhibits greatly enhanced yet controlled dissipation of static electricity into the air at the same rate from both sides of the fabric.

The present invention relates to a new fabric of novel construction which has a raised grid of electroconductive yarn extending from one side of the fabric and a smooth or substantially smooth grid on the other side of the fabric. The grid is formed during the construction of the base fabric by the novel methods described below.

Although it is anticipated that the grid can be slightly raised or discernible on the second side of the fabric, the grid is substantially more pronounced on one side than the other. The raised grid on one side of the fabric allows that side to exhibit substantially increased yet controlled dissipation of static electricity innocuously into the air on that side of the fabric and a superior, although lower dissipation on the other substantially smooth side of the fabric.

This improved directional electrostatic dissipating fabric is particularly adapted for use in garments such as "clean room" or operating room garments requiring the relatively rapid yet controlled dissipation of static electricity into the air and to assure that skin particles, dust and other particulate matter will not pass through the fabric. The construction of a fabric which has one smooth or relatively smooth surface and the other surface which has a raised grid allows garments to be manufactured which are comfortable to wear yet still function to rapidly dissipate static electricity from the other raised grid surface in a controlled manner. The garments are constructed from the fabric of the present invention so the smooth or substantially smooth side of the fabric is on the inside of the garment adjacent the skin of the wearer while the raised grid side of the fabric is on the outside of the garment.

BACKGROUND OF THE INVENTION

It is well known that normal clothing fabric when used in environments such as a clean room, hospital operating room or other areas where humidity is reduced or controlled, have the disadvantage of becoming charged with static electricity as a result of friction. Due to the reduced humidity the static electricity is not readily dissipated into the air and in extreme circumstances could even result in an undesirable and dangerous spark. Likewise, when ordinary cloth is used as a filter medium, the friction caused by the air and particles passing through the cloth results in the buildup of static electricity.

In clean room environments where semiconductors are manufactured even the existence of an electrical charge of relatively low voltage on the garments of workers could cause damage to the semiconductors. Thus, it is desirable to have the rapid yet controlled electrostatic discharge to prevent the residual voltage from adversely affecting the manufacturing process.

There is a need for electrostatic dissipating fabrics which can be used to construct garments, filter media and drop cloths which have characteristics appropriate for each end use. For example, the fabric used for the production of garments must be comfortable against the skin, washable without loss of its static dissipating properties, must be economical, and should be relatively opaque. For filter media, the electrostatic dissipating fabric should have a uniform and controllable permeability to air or other gases passing through the filter and should have relatively low permeability to prevent particulate contamination from passing through the filter medium. For drop cloth applications, the electrostatic dissipating fabric should be reasonably economical and have a smooth enough surface to avoid snagging or damaging the object being covered.

In U.S. Pat. No. 2,845,962 an anti-static fabric is disclosed which is made from a fibrous material containing electrically conductive carbon black in combination with fibrous material free from the carbon black. Such fabric, however, does not have the desired conductivity unless a substantial amount of carbon black is used which would result in reduced mechanical strength of the fiber, often leading to the fabric breaking during the processing step. Further, the appearance and hand of the product produced from fiber containing a substantial amount of carbon black is generally unsatisfactory.

U.S. Pat. No. 3,288,175 teaches the incorporation of a small quantity of metallic fibers in the textile fiber materials to produce an anti-static fabric. However, such fabric is undesirable as it is difficult to process and has an unsatisfactory hand. Further, a fabric produced in accordance with such method is relatively expensive.

U.S. Pat. No. 3,586,597 teaches the use of a fiber which is coated with a resinous matrix of finely divided silver or carbon black. However, such coating is not always sufficient to provide the necessary anti-static properties and often results in loss of anti-static properties as a result of normal processing such as dying, cutting and so forth. In particular, when such fabric is washed further degradation of its anti-static properties occurs.

Likewise, the anti-static cloth described in U.S. Pat. No. 3,986,530, which is formed from an electrically conductive thread having electroless, metal plated, staple fibers and metallic filaments combined in a specific amount, suffers a degradation of anti-static performance from loss of the coating as the fabric is flexed or otherwise processed or washed.

Further, the fabric described in U.S. Pat. No. 4,232,082, although containing conductive and non-conductive yarns, is particularly constructed to mask the presence of electroconductive fibers. This is accomplished by covering the electroconductive fibers with non-conductive fibers. There are no raised grids on either side of the fabric and consequently it does not exhibit enhanced or directional dissipation of static electricity.

SUMMARY OF THE INVENTION

The present invention, however, by utilizing known electroconductive filaments in a novel construction having a raised grid of electroconductive yarns on one side of the fabric results in an electrostatic dissipating fabric which avoids these and other disadvantages of the prior art. The construction of such fabric in a manner that results in a raised grid of electroconductive yarn on one side and a smooth or substantially smooth surface on the other side results in superior overall electrostatic dissipation characteristics relative to other conventional electrostatic dissipation fabrics and also results in enhanced directional dissipation performance. Nonetheless, the novel fabric construction is comfortable when constructed into garments with the smooth or substantially smooth side on the inside without sacrificing electrostatic performance since the side with the raised grid is on the outside.

It is an overall object of the present invention to produce an electrostatic dissipating fabric which, by virtue of its construction, exhibits a controlled rate of electrostatic dissipation superior to the static discharge performance of prior art fabrics and eliminates one or more of the aforesaid shortcomings of the prior art. Specifically, it is within the contemplation of the present invention to provide an improved electrostatic dissipating fabric and method of making such fabric which is woven or knit with a base fabric of desired construction and an integral grid woven or knit into the base fabric so that the grid extends above one surface of the base fabric and is flush or substantially flush with the other surface thereby enhancing the electrostatic dissipation performance of the fabric in the direction of the raised surface. Although both surfaces contribute to the dissipation of the static electricity, the surface with the higher raised grid exhibits a substantially greater rate of dissipation than the smooth or substantially smooth surface.

The method of the present invention utilizes a combination of construction of the fabric, relative yarn diameters and relative shrinkage rates or preweaving tension to produce a fabric having the raised grid on one side and a smooth or substantially smooth grid on the other side.

It is a primary object of the present invention to provide a fabric which dissipates electrostatic buildup directly into the air at an overall rate which is superior to prior art fabrics of this type and from a first side at a rate greater than from a second side due to the construction of a grid on the first side which is raised substantially higher than on the second relatively smooth or smooth side.

It is a further object of the present invention to provide a fabric which is constructed of polyester yarn in both the base fabric and the raised grid.

It is a further object of the present invention to provide a fabric which exhibits superior electrostatic performance based upon its construction and not upon the use of antistatic chemicals which wear off during use forming particulate matter which may become a contaminant or which wash out allowing degradation of the fabric over time due to repeated washing.

It is a further object of the present invention to provide a fabric which uniformly dissipates electrostatic buildup directly into the air before a sufficient charge can accumulate on the fabric to result in a spark.

It is a further object of the present invention to provide an electrostatic dissipating fabric which has improved comfort and hand for use in garments, particularly on the side of the fabric which is adjacent the wearer's skin.

It is a further object of the present invention to provide an electrostatic dissipating fabric which is economical to produce.

It is a still further object of the present invention to provide an electrostatic dissipating fabric having a base fabric of conventional yarn of substantially any formulation constructed in a weave or knit having properties (e.g. opacity, hand, porosity) appropriate for the particular end use.

In accordance with an illustrative embodiment demonstrating objects and features of the present invention, there is provided an improved electrostatic dissipating fabric having a constructed base fabric which is either woven or knitted. The base fabric has a first and second surface. A first plurality of electroconductive yarns is constructed into the base fabric during the weaving or knitting operation and extends from the one surface of the base fabric to the other surface. The first plurality of electroconductive yarns are oriented parallel to each other and extend beyond the plane of only one surface of the base fabric in a substantially mutually parallel orientation forming a raised substantially parallel grid on such surface of the base fabric and a smooth or substantially smooth, substantially parallel grid on the other surface.

An additional embodiment of the present invention provides a method whereby the fabric is woven or knit in a construction that results in double, triple or greater floats on one side such as a woven 2/1 twill construction in which the steps include weaving a base fabric from base fabric yarn in a 2/1 twill construction, substituting a plurality of electroconductive warp yarns having a diameter greater than the diameter of the base fabric yarns and a shrinkage rate greater than the shrinkage rate of the base fabric yarn in place of the base fabric warp yarns at spaced locations across the width of the fabric during the weaving step, substituting a plurality of electroconductive fill yarns having a greater diameter than the diameter of the base fabric yarns in place of the base fill yarns, laundering the woven fabric, drying the woven fabric and allowing the electroconductive warp yarn to shrink to a greater degree than the electroconductive fill yarn and the base fabric yarns forming a series of raised peaks on one side of the fabric in the warp direction and a series of raised double floats on the same side of the fabric in the fill direction.

BRIEF DESCRIPTION OF THE DRAWINGS

The above brief description, as well as further objects, features and advantages of the present invention will be more fully appreciated by reference to the following detailed description of the presently preferred, albeit illustrative embodiments according to the present invention, when taken in consideration with the accompanying drawings, wherein.

DETAILED DESCRIPTION OF THE DRAWINGS

Figure 1:
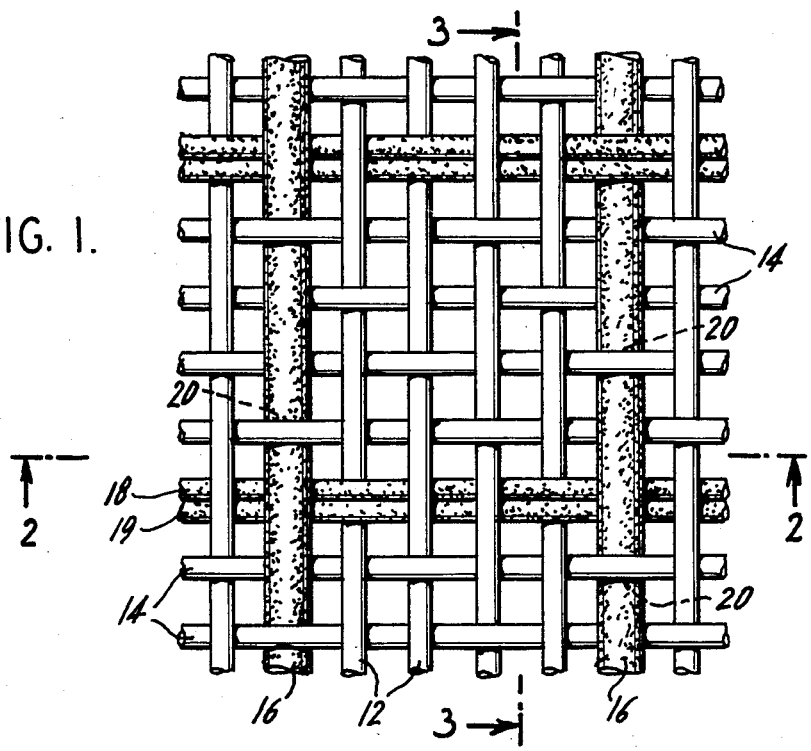
FIG. 1 is a top plan view of the improved fabric of the present invention in a woven construction, wherein the spacing between the yarns is increased to show the construction details.

Referring now to the drawings and specifically to FIG. 1, there is provided an improved, directional electrostatic dissipation fabric of the present invention. For the sake of illustration, the present invention is shown as a woven fabric constructed in enlarged scale with the spacing between the yarn in the warp and fill direction exaggerated. Additionally, for the sake of clarity, the number of warp and fill yarns in the base fabric has been greatly reduced. The base fabric can be formed of any natural or man made material including in particular non-conductive man made fiber such as polyester, aromatic polyimide (sold under the trademark NOMEX) or of natural fibers such as cotton. Although it is preferred to use filament yarns rather than spun yarns in the base fabric to reduce the likelihood of pieces of spun yarn becoming a contaminant, either yarn type can be used for the base fabric. Generally, the material chosen for the base fabric depends on the look, color, hand and permeability desired in the end product.

It is also possible to use conductive yarn or a combination of conductive and non-conductive yarn in the base fabric; however, such yarns are substantially more expensive and do not provide a commensurate increase in electrostatic dissipating performance. For the sake of clarity the details of construction of the improved fabric of the present invention are described herein with reference to the base fabric being formed from non-conductive yarn.

The fabric shown in the drawings is constructed in a 2/1 weave. As more fully described below, the combination of such fabric construction along with differential shrinkage rates between the electroconductive warp grid yarn on the one hand and the yarns forming the remainder of the fabric on the other, cause a raised grid to be formed only on the back surface or far side of the fabric shown in FIG. 1 and a smooth or substantially smooth grid to be formed on the front surface shown in FIG. 1. Although it is possible to use other woven or knit constructions, it has been found that a 2/1 twill weave exhibits ideal characteristics of both electrostatic dissipating performance and permeability. A 3/1 twill weave is looser and thus may not trap particles of small enough size and a 1/1 weave will create a raised grid on both sides of the fabric.

In FIG. 1, the non-conductive warp yarn 12 is provided by a conventional beam (not shown) while the non-conductive fill yarn 14 is provided by a shuttle or by a weft insertion mechanism (not shown), in a conventional manner. As shown in FIG. 1, the conductive yarn is woven into the base fabric as an integral portion of such fabric. The electroconductive warp yarn 16 is also provided by the beam (not shown) in a conventional manner and the electroconductive fill yarn 18, 19 by the shuttle.

Advantageously, the conductive yarn in both the warp and fill is commercially available conductive "carbon co-extruded" or "conjugated" yarn which is formed from carbon-doped polyester multifilaments; i.e. polyester multifilament yarn with conductive carbon particles disbursed therethrough. The conductive conjugated yarn is then plied to multifilament yarn to produce a conductive yarn of the desired diameter. It is also possible to use electroconductive yarn formed by plying carbon-doped nylon multifilament yarn (such as the type sold by Monsanto Textiles Company under the trademark NO SHOCK) to non-conductive multi-filament yarn to produce a conductive yarn of the desired diameter. It is preferred to use the copyrighted or carbon-doped yarn rather than carbon coated yarn since the latter exhibits a loss of conductivity when subject to further normal processing such as dyeing, scouring and laundering, e.g. washing or dry cleaning. Nonetheless, carbon coated electroconductive yarn could be used to produce the fabric of the present invention.

In the electrostatic dissipating fabric, the electroconductive warp grid yarn 16 has a larger denier or diameter than the non-conductive warp and fill yarns 12, 14 forming the base fabric. As shown in FIG. 1, the electroconductive fill grid yarn 18, 19 is formed from a pair of substantially the same denier electroconductive yarns that are woven together as a single yarn. The denier of each electroconductive fill yarn 18, 19 can be substantially the same as the denier of the fill yarn 14 forming the base fabric.

In the one embodiment of the present invention the base fabric is formed from a polyester multifilament yarn 12, 70 denier, "Z" twisted, in the warp direction and a 100 denier polyester yarn 14, without twist in the fill direction. The degree of twist of the yarn comprising the warp and fill of the base fabric is not critical. However, it is known that a zero twist advantageously decreases the overall permeability of the fabric.

The electroconductive warp grid is formed from a combination of 250 denier polyester yarn and 20 denier conjugated carbon polyester yarn, plied 7 turns per inch. The electroconductive yarn comprising the fill grid is formed from a pair of plied yarns 18, 19, with each yarn formed from 100 denier polyester yarn plied to 20 denier conjugated carbon polyester yarn, 7 turns per inch. The yarn comprising the electroconductive warp grid 16 is relatively high shrinkage yarn (approximately 15% shrinkage) while the remaining yarns have normal shrinkage (approximately 10% shrinkage).

The raised grid is formed on the reverse side of the fabric shown in FIG. 1 by the combination of the 2/1 woven twill construction; the difference in the diameters between the 250 denier and two 100 denier yarns forming the electroconductive warp and fill grids 16 and 18, 19, respectively and the yarns forming the base fabric; and the difference in the 15% shrinkage rate of the yarn used in the conductive warp grid 16 as compared to the 10% shrinkage rate of the yarn used in the remainder of the fabric. It has been found that the combination of such factors results in the construction of fabric which exhibits the desired physical characteristics and enhanced electrostatic dissipating performance of the present invention.

As best shown in the plan view of FIG. 1, each base fabric warp yarn 12 passes over two and under one base fabric fill yarn 14. Similarly, the electroconductive warp grid yarn 16 passes over two and under one base fabric fill yarn 14. As shown in the section view of FIG. 2 the larger diameter of the electroconductive warp grid yarn 16 extends downwardly a distance R above the surface S defined by the diameter of the warp yarns 12. Although the base fabric yarns 12, 14 are shown shematically in FIG. 2 as being at different levels, in actuality, when a 2/1 fabric is woven with the appropriate number of ends and picks per inch, the base fabric warp and fill yarns, 12, 14 cooperate to define the surface shown by the reference letter "S" in FIG. 2.

Figure 2:
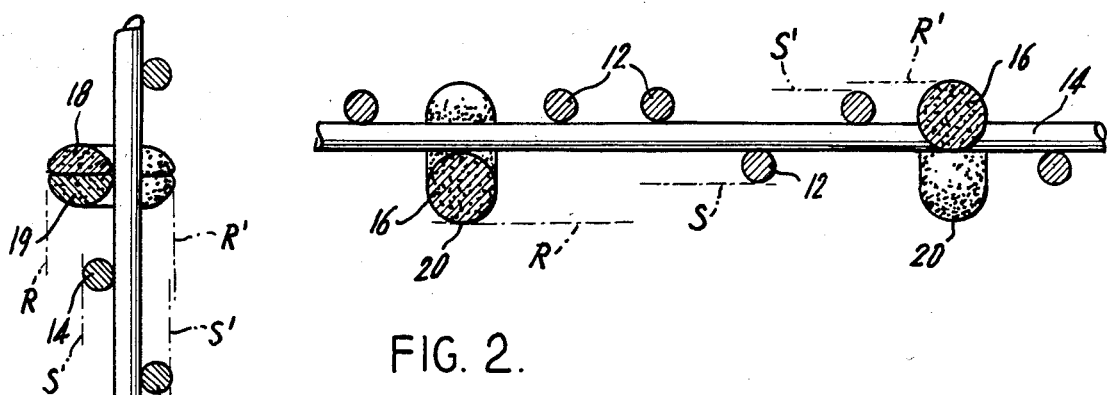
FIG. 2 is a partial section view in enlarged scale through the warp, taken substantially along the line 2—2 of FIG. 1 in the direction of the arrows.

The raised grid or stripe in the warp direction is formed when the electroconductive warp yarn 16 crosses behind each third fill yarn 14. At such crossing point a peak 20 is formed. During the subsequent processing, due to the differential shrinkage rates of the material comprising the various yarns, the electroconductive warp yarn 16 shrinks to a greater degree than the other yarns forming the fabric producing a sharp peak 20 extending to the distance "R" below the surface "S" shown in FIG. 2. Since the actual fabric has a large number of peaks 20 located in close proximity to each other, a substantially solid line of peaks is formed on the back side of the fabric. Such line of peaks is formed repeatedly at spaced locations across the width of the back side of the fabric forming a raised grid of substantially parallel lines at any desired spacing. Due to the 2/1 fabric construction, when the electroconductive warp yarn 16 passes on top of the fill yarns 14 as shown in FIG. 1, there is a smooth double float rather than a sharp peak. Thus, the height of the electroconductive warp yarn 16 on the top of the fabric as depicted by the letter "R'" in FIG. 2 is substantially the same as the height of the warp and fill yarns 12, 14 forming the base fabric, deptictied by the letter "S'".

Figure 3:
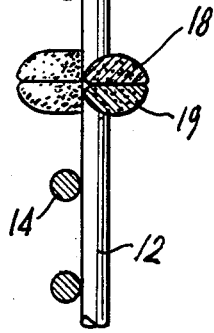
FIG. 3 is a partial section view in enlarged scale through the fill, taken substantially along the line 3—3 of FIG. 1 in the direction of the arrows.

As best shown in FIG. 3, the raised grid is formed in the fill direction on the back side of the fabric of FIG. 1 by the use of side-by-side or "double pick" electroconductive fill yarns 18, 19, each of a denier approximately equal to the denier of the base fabric fill yarns 14. The double pick yarns thus have a combined diameter greater than the base fabric fill yarns 14. The 2/1 construction of the fabric results in an arrangement where the electroconductive fill yarns 18, 19 are always positioned such that such yarns form a double float on the back side of the fabric by passing under two base fabric warp yarns 12, 12 or a combination of one base fabric warp yarn 12 and one electroconductive warp grid yarn 16 and over only one base fabric warp yarn 12 or one electroconductive warp yarn grid 16 throughout the entire width of the fabric. As shown in FIG. 3, since the electroconductive fill yarns 18, 19 are double pick or knitted together as a single yarn, the pair of electroconductive fill yarns 18, 19 are raised below the back surface of the fabric of FIG. 1 to a distance "R" below the surface "S" formed by the plurality of fill yarns 14, 14. As discussed above with respect to FIG. 2, FIG. 3 shows the surface of the base fabric schematically. Consequently, the back side of the fabric shown in FIG. 1 contains a plurality of substantially parallel electroconductive fill grid lines formed of double floats raised off the surface of the base fabric.

Further, as shown in the section view of FIG. 3, the front side of the fabric of FIG. 1 is substantially smooth in that the side-by-side electroconductive fill yarns 18, 19 are only raised above the front surface of the fabric a distance "R'" which is substantially the same as the height "S'" of the plurality of base fabric warp and fill yarns 12, 14 on the front side of such fabric.

The combination of the raised lines of electroconductive warp yarns 16 and the raised electroconductive fill yarns 18, 19 form a substantially square raised grid pattern on the back side of the fabric of FIG. 1. Although the size of the grid can vary, a substantially square grid of ¼ inch square has been found to provide good electrostatic performance, acceptable hand and reasonable cost.

The improved electrostatic dissipating fabric of the present invention can also be produced by weaving techniques utilizing differential pre-weaving tension. In such instance, an otherwise conventional weaving loom having double beaming can be used. The double beaming allows the warp yarn 12 comprising the base fabric to be woven at a different pre-weaving tension than the electroconductive warp yarns 16. In order to form the raised grid in the warp direction, the base fabric warp yarn 12 is woven at the normal tension required for weaving satisfactory base fabric and the electroconductive warp yarn 16 is woven at a lower pre-weaving tension. When the fabric is subsequently processed, the electroconductive warp yarn 16, due to its reduced pre-weaving tension, forms a plurality of sharp peaks 20 wherever the electroconductive warp yarn 16 passes under a base fabric fill yarn 14 as shown in FIG. 2—2. Again, since the actual fabric has a large number of peaks 20 formed in a line, a raised grid is formed in the warp direction on the back side of the fabric.

Figure 4:
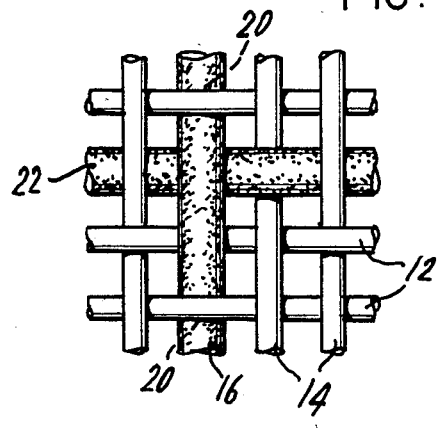
FIG. 4 is a top plan view of an alternative woven construction of the improved fabric of the present invention.

When differential tension is used, the electroconductive fill grid yarn can be two side-by-side yarns 18, 19 which are double pick woven in place of a single yarn or can be a single, larger denier electroconductive yarn 22 in the alternate construction of the fabric of the present invention shown in FIG. 4. As discussed above, the raised grid in the fill direction is formed by the pair of electroconductive fill grid yarns 18, 19 (FIG. 1) or the single, relatively large denier electroconductive fill grid yarn 22 forming a double float on the far side of the fabric when it passes under two base fabric warp yarns 12, 12 or the combination of one electroconductive warp yarn 16 and one base fabric warp yarn 12 (FIG. 4) and over one base fabric warp yarn 12.

Further, the alternative construction of the fabric depicted schematically in plan view in FIG. 4 can be produced by using a relatively high shrinkage electroconductive warp grid yarn 16 in combination with a single, relatively large denier electroconductive fill grid yarn 22. The raised line or stripe is formed in the warp direction during processing when the higher shrinkage electrostatic warp grid yarn 16 shrinks at a greater rate than the yarns forming the remainder of the fabric producing a series of peaks 20 on the back side of the fabric shown in FIG. 4. The raised grid in the fill direction results from the combination of the larger diameter electrostatic fill grid yarn 22 and the 2/1 fabric construction.

Although the preferred and alternate embodiments of the present invention are described by reference to weaving, it should be understood that similar advantages are obtained by constructing the fabric of the present invention by knitting.

The means by which the improved electrostatic performance of the fabric of the present invention is obtained is not fully understood; however, it is believed that the raised grid on one side of the fabric acts to concentrate the static electricity along the electroconductive grid lines on that side of the fabric resulting in the enhanced but controlled dissipation of the static electricity from that side of the fabric. Specifically, as shown by the tests performed on a fabric sample produced in accordance with the present invention, the side of the fabric with the raised grid exhibits substantially increased static dissipation compared to the side of the fabric with the smooth or substantially smooth grid.

A sample of the fabric was constructed in accordance with the present invention in a 2/1 twill. The fabric had a finished count of 173 ends per inch in the warp and 81 picks per inch in the fill producing a fabric that weighed 3.07 ounces per square yard and had permeability to air of 14.4 cubic feet per minute, as measured by a standardized test. The base fabric was woven from 70 denier dacron polyester yarn twisted 10 turns in the warp and 100 denier dacron polyester yarn in the fill, which is not twisted. The electroconductive warp grid yarn 16 is high shrink 250 denier dacron polyester plied to 20 denier conjugated carbon polyester yarn, 7 turns per inch. The electroconductive grid fill yarn 20 is 100 denier dacron polyester plied to 20 denier conjugated carbon polyester yarn, 7 turns per inch which is double pick woven. All yarns are multifilament. The electroconductive warp and fill grids are woven into the fabric at spacing of ¼ inch. After weaving, the fabric is processed in the conventional manner including scouring and drying using soap and water to remove surface oils and films. The fabric can be calendared to give the fabric an improved hand.

Subsequent to the conventional processing, the fabric of the present invention was tested using the NASA standard Triboelectric test. In such test the fabric is held in a frame which is isolated electrically. Next, a teflon wheel capable of building up a static charge of approximately 22,000 volts is used on standard fabric to burnish the corner of the fabric. The frame is then swung between two electrodes and the electrical potential on the fabric is measured as a function of time. As shown by the following tables although both sides of the fabric exhibited superior electrostatic dissipating performance when compared to prior art fabrics, the side of the fabric having the raised grid exhibited substantially better electrostatic dissipating performance than the side of the fabric which is smooth or substantially smooth:

| Time (Seconds) | Voltage Remaining After Time | | | | | | |
|---|---|---|---|---|---|---|---|
| | 0.35 | 0.5 | 1.0 | 2.0 | 3.0 | 4.0 | 5.0 |
| Side: | | | | | | | |
| Raised | 330 | 205 | 180 | 170 | 150 | 150 | 150 |
| Smooth | 580 | 290 | 280 | 270 | 270 | 260 | 260 |

This test was performed in an environment maintained at 73 degrees Fahrenheit and 47 percent relative humidity.

Although the present invention was described, by reference to the base fabric being produced from electroconductive yarn, it should be understood that, if desired, conductive yarn can be used in the base fabric as well. However, in such instance, the cost of the fabric will increase. Further, the use of polyester or other nonconductive yarns to produce the base fabric improves the hand of the fabric and makes it more suitable for use in clothing. The fabric of the present invention is ideally suited to such application in that a smooth or substantially smooth surface is more comfortable for the inside of the garment and the raised outer surface exhibits the enhanced static dissipation performance. The filtering capability of the fabric prevents skin particles and other body born contaminants from passing through the fabric.

The use of carbon doped yarn, rather than carbon coated yarn, as a component of the yarn forming the electroconductive warp and fill grids results in the fabric of the present invention maintaining its electrostatic performance in spite of repeated washing and or dry cleanings. Further, since the electroconductive properties of the yarn result from the presence of the carbon particles within the yarn, chemicals such as "Ethyl Quad" are not required to obtain or maintain uniform and consistent electrostatic dissipating performance. Thus, there is no degradation after repeated washings or cleanings as in the case of fabric which must be treated with Ethyl Quad to obtain or maintain static dissipating performance.

A latitude of modification, change and substitution is intended in the foregoing disclosure and, in some instances, some features of the invention will be employed without a corresponding use of other features. Accordingly, it is appropriate that the appended claims be construed broadly and in a manner consistent with the scope of the invetion herein.

We claim:

1. An improved static dissipating fabric comprising a base fabric constructed of base fabric yarn having a front surface and a back surface, a first plurality of electroconductive yarns constructed into said base fabric extending from said front surface to said back surface of said base fabric and extending substantially beyond the plane of said back surface in a substantially mutually parallel orientation to each other thereby forming a raised substantially parallel grid on said back surface of said base fabric and a smooth or substantially smooth grid on said front surface.

2. The improved fabric of claim 1 further including a second plurality of raised electroconductive yarns constructed into said base fabric in a direction substantially perpendicular to said first plurality of raised electroconductive yarns and extending from said front surface to said back surface of said base fabric and extending substantially beyond the plane of said back surface forming a raised substantially rectangular grid with said first and said second pluralities of raised electroconductive yarns on said back surface of said base fabric and a smooth or substantially smooth grid on said front surface.

3. The improved fabric of claim 1 wherein said first plurality of raised electroconductive yarns comprise a combination of electroconductive carbon doped multifilament yarns plied with non-conductive multi-filament yarns and a diameter of said first plurality of said plied electroconductive yarns is greater than a diameter of said base fabric yarns forming said base fabric.

4. The improved fabric of claim 2 wherein said first and said second pluralities of raised electroconductive yarns comprise combinations of electroconductive carbon doped filament yarns plied with non-conductive filament yarns and a diameter of said first and said second pluralities of raised electroconductive yarns are greater than a diameter of said base fabric yarns forming said base fabric.

5. An improved static dissipating fabric comprising a base fabric having a front and a back surface which is woven from warp and fill base fabric yarn in a 2/1 twill construction, a first plurality of electroconductive yarns integrally woven into said base fabric at spaced locations across said warp of said base fabric in place of said base fabric warp yarn, each of said electroconductive warp yarns in said plurality of warp yarns having a diameter greater than the diameter of said base fabric warp yarns, a second plurality of electroconductive yarns integrally woven into said base fabric at spaced locations along the fill of said base fabric in place of said base fabric fill yarn, a first plurality of raised grid lines formed from peaks of said electroconductive warp yarn in the warp direction extending from said back surface of said base fabric at said spaced locations along said warp direction of said base fabric and a second plurality of raised grid lines formed from double floats of said electroconductive fill yarn in the fill direction extending from said back surface of said base fabric whereby the back surface of said fabric has a raised substantially rectangular grid of electrostatic yarn and the front surface of said fabric is substantially smooth.

6. The fabric of claim 5 wherein said electroconductive fill yarns are further comprised of a pair of side-by-side electroconductive yarns knit together.

7. The fabric of claim 5 wherein said electroconductive warp and said electroconductive fill yarns are each comprised of a non-conductive yarn plied to a conductive yarn.

8. The fabric of claim 5 wherein said base fabric warp and fill yarns are comprised of non-conductive material.

9. The method of manufacturing the improved fabric of the present invention having a raised electroconductive grid on one side of the fabric and a smooth or substantially smooth grid on the other side of the fabric comprising the steps of:
   (a) weaving a fabric from base fabric yarn in a 2/1 twill construction;
   (b) substituting a plurality of electroconductive warp yarns having a diameter greater than the diameter of the base fabric yarn and a higher shrinkage rate than the shrinkage rate of said base fabric yarn in place of the base fabric warp yarn at spaced locations across the width of the fabric during the weaving operation;
   (c) substituting a plurality of electroconductive fill yarns in place of the base fabric fill yarns at spaced locations along the length of the fabric during the weaving operation wherein each said electroconductive fill yarn has a diameter greater than the diameter of the base fabric yarn and a shrinkage rate substantially the same as the shrinkage rate of said base fabric yarn
   (d) laundering the woven fabric;
   (e) drying the woven fabric and allowing the electroconductive warp yarn to shrink to a greater degree than the electroconductive fill yarn and the base fabric yarns forming a series of raised peaks on one side of said fabric in the warp direction and a series of raised floats on said one side of the said fabric in said fill direction.

10. The method according to claim 9 wherein said large diameter electroconductive fill yarn is formed from two smaller diameter electroconductive fill yarns woven together as a single yarn.

11. The method according to claim 9 wherein the base fabric yarn is a non-conductive multifilament yarn.

12. The method according to claim 10 wherein the base fabric yarn is non-conductive multifilament yarn.

13. The method of making the improved fabric of the present invention having a raised electroconductive grid on one side of the fabric and a smooth or substantially smooth grid on the other side of the fabric comprising the steps of:
   (a) weaving a fabric from base fabric warp and fill yarn in a 2/1 twill construction;
   (b) locating a plurality of electroconductive warp yarns in spaced relationship across the width of said base fabric with each electroconductive warp yarn having a diameter greater than a diameter of the base fabric warp yarn;
   (c) applying a preweaving tension to each base fabric warp yarn;
   (d) applying a lower preweaving tension to each of said electroconductive warp yarns than the preweaving tension on said base fabric warp yarns;
   (e) locating a plurality of electroconductive fill yarns at spaced locations along the length of the fabric wherein the diameter of said electroconductive fill yarns is greater than the diameter of the base fabric fill yarn;
   (f) laundering the fabric;
   (g) drying the woven fabric and allowing the electroconductive warp yarn to form a series of raised peaks on one side of said fabric in the warp direction and a series of raised floats on said side of the fabric in the fill direction.

14. The method according to claim 13 wherein each said large diameter electroconductive fill yarn is formed from two smaller diameter electroconductive fill yarns woven together as a single yarn.

15. The method according to claim 13 wherein the yarn comprising the base fabric is a non-conductive multifilament yarn.

16. The method according to claim 14 wherein the yarn comprising the base fabric is a non-conductive multifilament yarn.

17. The method according to claim 13 further including the step of plying a multifilament non-conductive yarn to an electroconductive carbon doped conjugated yarn to produce a plied electroconductive yarn having a diameter greater than the diameter of the base fabric yarn.

18. The improved static dissipating fabric made in accordance with the method of claim 9.

19. The improved static dissipating fabric made in accordance with the method of claim 13.

* * * * *